United States Patent
Keller et al.

(10) Patent No.: US 9,412,926 B2
(45) Date of Patent: Aug. 9, 2016

(54) HIGH POWER SOLID-STATE LAMP

(75) Inventors: Bernd Keller, Santa Barbara, CA (US); James Ibbetson, Santa Barbara, CA (US)

(73) Assignee: CREE, INC., Goleta, CA (US)

( * ) Notice: Subject to any disclaimer, the term of this patent is extended or adjusted under 35 U.S.C. 154(b) by 0 days.

(21) Appl. No.: 11/149,999

(22) Filed: Jun. 10, 2005

(65) Prior Publication Data

US 2008/0007953 A1   Jan. 10, 2008

(51) Int. Cl.
*H01L 33/64* (2010.01)
*H01L 33/60* (2010.01)

(52) U.S. Cl.
CPC .............. *H01L 33/641* (2013.01); *H01L 33/60* (2013.01); *H01L 33/642* (2013.01); *H01L 2924/0002* (2013.01)

(58) Field of Classification Search
CPC ... F21V 29/004; F21V 29/02; F21Y 2101/02; F21K 9/00; F21S 4/001; H01J 61/52
USPC ................ 362/294, 631, 227, 264, 373, 800; 165/185; 361/701–704, 709, 710
See application file for complete search history.

(56) References Cited

U.S. PATENT DOCUMENTS

| | | | |
|---|---|---|---|
| 2,394,992 A | 2/1946 | Franck | 362/311.12 |
| 3,143,592 A | 8/1964 | August | 174/16.3 |
| 3,581,162 A | 5/1971 | Wheatley | |
| 4,204,246 A | 5/1980 | Arii et al. | 361/699 |
| 4,219,871 A | 8/1980 | Larrimore | 362/264 |
| 4,507,254 A * | 3/1985 | Daniels et al. | 264/1.9 |
| 4,727,289 A | 2/1988 | Uchida | 315/71 |
| 4,946,547 A | 8/1990 | Palmour et al. | 156/643 |
| 5,140,220 A | 8/1992 | Hasegawa | 313/512 |
| 5,200,022 A | 4/1993 | Kong et al. | 156/612 |
| RE34,861 E | 2/1995 | Davis et al. | 437/100 |
| 5,410,412 A * | 4/1995 | Gombocz et al. | 356/417 |
| 5,463,280 A | 10/1995 | Johnson | |
| 5,535,230 A | 7/1996 | Abe | |
| 5,561,346 A | 10/1996 | Byrne | 313/512 |

(Continued)

FOREIGN PATENT DOCUMENTS

CN   1425117    6/2003
CN   1465106 A  12/2003

(Continued)

OTHER PUBLICATIONS

Decision for Grant for Japanese Patent Application No. 2008-515705. dated Dec. 6, 2011.

(Continued)

*Primary Examiner* — Jong-Suk (James) Lee
*Assistant Examiner* — Mark Tsidulko
(74) *Attorney, Agent, or Firm* — Koppel, Patrick Heybl & Philpott (57) ABSTRACT

A high power semiconductor component structure having a semiconductor device arranged to operate in response to an electrical signal, with the device heating up during operation in response to the electrical signal. A heat sink is positioned in thermal contact with the semiconductor device such that heat from the device transmits into the first heat sink. The heat sink has at least partially a porous material region of a thermally conductive material in a 3-dimensional pore structure with the surfaces of the pore structure providing surface area for heat to dissipate into the ambient air.

60 Claims, 4 Drawing Sheets

(56) References Cited

U.S. PATENT DOCUMENTS

| | | | |
|---|---|---|---|
| 5,581,683 A | 12/1996 | Bertignoll et al. | |
| 5,585,783 A | 12/1996 | Hall | |
| 5,655,830 A | 8/1997 | Ruskouski | |
| 5,688,042 A | 11/1997 | Madadi et al. | 362/240 |
| 5,785,418 A * | 7/1998 | Hochstein | 362/373 |
| 5,806,965 A | 9/1998 | Deese | |
| 5,838,101 A | 11/1998 | Pappalardo | 313/487 |
| 5,850,126 A | 12/1998 | Kanbar | 315/200 A |
| 5,890,794 A | 4/1999 | Abtahi et al. | |
| 5,931,570 A | 8/1999 | Yamuro | 362/355 |
| 5,934,798 A * | 8/1999 | Roller et al. | 362/497 |
| 5,947,588 A | 9/1999 | Huang | |
| 5,949,347 A | 9/1999 | Wu | |
| 5,959,316 A | 9/1999 | Lowery | 257/98 |
| 6,084,770 A * | 7/2000 | Wyland | 361/692 |
| 6,218,785 B1 | 4/2001 | Incerti | 315/185 S |
| 6,220,722 B1 | 4/2001 | Begemann | |
| 6,220,731 B1 * | 4/2001 | Ryan | 362/373 |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,270,722 B1 | 8/2001 | Yang et al. | 422/37 |
| 6,276,822 B1 | 8/2001 | Bedrosian et al. | |
| 6,350,041 B1 | 2/2002 | Tarsa et al. | 362/231 |
| 6,397,450 B1 | 6/2002 | Ozmat | 29/428 |
| 6,404,131 B1 | 6/2002 | Kawano et al. | 315/82 |
| 6,465,961 B1 | 10/2002 | Cao | 315/58 |
| 6,517,221 B1 | 2/2003 | Xie | 362/373 |
| 6,523,978 B1 | 2/2003 | Huang | |
| 6,550,953 B1 | 4/2003 | Ichikawa et al. | |
| 6,634,770 B2 | 10/2003 | Cao | |
| 6,659,632 B2 | 12/2003 | Chen | |
| 6,709,132 B2 | 3/2004 | Ishibashi | |
| 6,746,885 B2 | 6/2004 | Cao | 438/26 |
| 6,764,202 B1 * | 7/2004 | Herring et al. | 362/371 |
| 6,803,607 B1 | 10/2004 | Chan et al. | |
| 6,848,819 B1 | 2/2005 | Arndt et al. | |
| 6,860,620 B2 * | 3/2005 | Kuan et al. | 362/294 |
| 6,864,513 B2 | 3/2005 | Lin et al. | |
| 6,910,794 B2 | 6/2005 | Rice | 362/547 |
| 6,948,829 B2 | 9/2005 | Verdes et al. | |
| 6,982,518 B2 | 1/2006 | Chou et al. | |
| 6,997,580 B2 | 2/2006 | Wong | 362/311.02 |
| 7,045,205 B1 * | 5/2006 | Sager | 428/304.4 |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,094,362 B2 | 8/2006 | Setlur et al. | 252/301 |
| 7,140,753 B2 | 11/2006 | Wang et al. | 362/294 |
| 7,144,135 B2 | 12/2006 | Martin et al. | |
| 7,160,012 B2 | 1/2007 | Hilscher et al. | |
| 7,160,120 B2 | 1/2007 | Zhang et al. | |
| 7,165,866 B2 | 1/2007 | Li | |
| 7,172,314 B2 | 2/2007 | Currie et al. | |
| 7,213,940 B1 | 5/2007 | Van de Ven | 257/89 |
| 7,270,446 B2 | 9/2007 | Chang et al. | 362/294 |
| 7,350,936 B2 | 4/2008 | Ducharme et al. | 362/231 |
| 7,354,174 B1 | 4/2008 | Yan | |
| 7,377,674 B2 * | 5/2008 | Klinkman et al. | 362/484 |
| 7,396,142 B2 | 7/2008 | Laizure, Jr. et al. | |
| 7,401,643 B2 * | 7/2008 | Queheillalt et al. | 165/104.21 |
| 7,405,857 B2 | 7/2008 | Ma et al. | |
| 7,413,325 B2 | 8/2008 | Chen | 362/249.01 |
| D581,556 S | 11/2008 | To et al. | D26/2 |
| 7,547,124 B2 | 6/2009 | Chang et al. | 362/373 |
| 7,549,782 B2 | 6/2009 | Ng et al. | 362/555 |
| 7,553,047 B2 | 6/2009 | Shin et al. | 362/294 |
| 7,600,882 B1 | 10/2009 | Morejon et al. | |
| 7,607,802 B2 | 10/2009 | Kang et al. | 362/294 |
| 7,710,016 B2 | 5/2010 | Miki | 257/98 |
| 7,726,836 B2 | 6/2010 | Chen | |
| 7,740,365 B2 | 6/2010 | Huttner et al. | 362/97 |
| 7,753,568 B2 | 7/2010 | Hu et al. | 362/373 |
| 7,810,954 B2 | 10/2010 | Kolodin | 362/277 |
| 7,824,065 B2 | 11/2010 | Maxik | |
| 7,884,538 B2 | 2/2011 | Mitsuishi et al. | 313/502 |
| 7,976,335 B2 | 7/2011 | Weber et al. | 439/487 |
| 7,989,236 B2 | 8/2011 | Yamaguchi et al. | 438/26 |
| 8,021,025 B2 | 9/2011 | Lee | |
| 8,235,571 B2 | 8/2012 | Park | 362/555 |
| 8,253,316 B2 | 8/2012 | Sun et al. | |
| 8,272,762 B2 | 9/2012 | Maxik et al. | |
| 8,274,241 B2 | 9/2012 | Guest et al. | |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. | 257/79 |
| 8,314,537 B2 | 11/2012 | Gielen et al. | 313/46 |
| 8,322,896 B2 | 12/2012 | Falicoff et al. | |
| 8,348,470 B2 | 1/2013 | Liu et al. | 362/294 |
| 8,371,722 B2 | 2/2013 | Carroll | |
| 8,400,051 B2 | 3/2013 | Hakata et al. | |
| 8,410,512 B2 | 4/2013 | Andrews | 257/99 |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,449,154 B2 | 5/2013 | Uemoto et al. | |
| 8,502,468 B2 | 8/2013 | Li et al. | |
| 8,568,009 B2 | 10/2013 | Chiang et al. | 362/563 |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 8,922,106 B2 | 12/2014 | Helbing et al. | 313/318.11 |
| 2002/0047516 A1 | 4/2002 | Iwasa et al. | 313/512 |
| 2002/0108743 A1 * | 8/2002 | Wirtz | 165/185 |
| 2002/0114169 A1 | 8/2002 | Harada | 362/558 |
| 2003/0021113 A1 | 1/2003 | Begemann | |
| 2003/0038291 A1 | 2/2003 | Cao | |
| 2003/0081419 A1 | 5/2003 | Jacob | 362/364 |
| 2003/0185005 A1 | 10/2003 | Sommers et al. | |
| 2004/0021629 A1 | 2/2004 | Sasuga et al. | |
| 2004/0201990 A1 | 10/2004 | Neyer | |
| 2004/0223315 A1 | 11/2004 | Suehiro et al. | 362/84 |
| 2005/0068776 A1 | 3/2005 | Ge | 362/296.08 |
| 2005/0168990 A1 | 8/2005 | Nagata et al. | 362/294 |
| 2005/0174780 A1 | 8/2005 | Park | 362/294 |
| 2005/0184638 A1 | 8/2005 | Mueller | 313/485 |
| 2005/0201098 A1 * | 9/2005 | DiPenti et al. | 362/294 |
| 2005/0219060 A1 | 10/2005 | Curran et al. | 340/815.45 |
| 2005/0225988 A1 | 10/2005 | Chaves et al. | |
| 2005/0276053 A1 | 12/2005 | Nortrup et al. | 362/294 |
| 2006/0097245 A1 | 5/2006 | Aanegola et al. | 257/26 |
| 2006/0097385 A1 | 5/2006 | Negley | 257/722 |
| 2006/0105482 A1 | 5/2006 | Alferink et al. | 438/22 |
| 2006/0138435 A1 | 6/2006 | Tarsa et al. | 257/89 |
| 2006/0152140 A1 | 7/2006 | Brandes | 313/503 |
| 2006/0152820 A1 | 7/2006 | Lien et al. | 359/726 |
| 2006/0157225 A1 * | 7/2006 | Martin et al. | 165/80.4 |
| 2006/0180774 A1 | 8/2006 | Endo | 250/485.1 |
| 2006/0215411 A1 * | 9/2006 | Lin | 362/382 |
| 2006/0227558 A1 | 10/2006 | Osawa et al. | |
| 2006/0254762 A1 * | 11/2006 | Tao et al. | 165/177 |
| 2007/0047232 A1 | 3/2007 | Kim et al. | |
| 2007/0090737 A1 | 4/2007 | Hu et al. | 313/11 |
| 2007/0091633 A1 | 4/2007 | Harrity et al. | |
| 2007/0139949 A1 | 6/2007 | Tanda et al. | 362/551 |
| 2007/0158668 A1 | 7/2007 | Tarsa et al. | 257/98 |
| 2007/0182299 A1 | 8/2007 | Ouderkirk | 313/110 |
| 2007/0215890 A1 | 9/2007 | Harbers et al. | |
| 2007/0263405 A1 | 11/2007 | Ng et al. | 362/555 |
| 2007/0267976 A1 | 11/2007 | Bohler et al. | 315/112 |
| 2007/0274080 A1 | 11/2007 | Negley et al. | 362/341 |
| 2007/0285924 A1 | 12/2007 | Morris et al. | 362/264 |
| 2008/0037257 A1 | 2/2008 | Bolta | |
| 2008/0055908 A1 | 3/2008 | Wu et al. | 362/294 |
| 2008/0062694 A1 | 3/2008 | Lai et al. | 362/294 |
| 2008/0080165 A1 | 4/2008 | Kim et al. | |
| 2008/0093615 A1 | 4/2008 | Lin et al. | |

(56) References Cited

U.S. PATENT DOCUMENTS

| | | | |
|---|---|---|---|
| 2008/0106893 A1 | 5/2008 | Johnson et al. | |
| 2008/0117620 A1 | 5/2008 | Hama et al. | 362/84 |
| 2008/0128735 A1 | 6/2008 | Yoo et al. | |
| 2008/0149166 A1 | 6/2008 | Beeson et al. | 136/248 |
| 2008/0173884 A1 | 7/2008 | Chitnis et al. | 257/98 |
| 2008/0179611 A1 | 7/2008 | Chitnis et al. | 257/98 |
| 2008/0232119 A1 | 9/2008 | Ribarich | 362/373 |
| 2008/0285279 A1 | 11/2008 | Ng et al. | 362/249 |
| 2008/0308825 A1 | 12/2008 | Chakraborty et al. | 257/98 |
| 2009/0001399 A1 | 1/2009 | Diana et al. | 257/98 |
| 2009/0015137 A1 | 1/2009 | Su et al. | 313/503 |
| 2009/0040760 A1 | 2/2009 | Chen et al. | 362/249 |
| 2009/0046473 A1 | 2/2009 | Tsai et al. | 362/373 |
| 2009/0058256 A1 | 3/2009 | Mitsuishi et al. | 313/487 |
| 2009/0067180 A1 | 3/2009 | Tahmosybayat | 362/339 |
| 2009/0086492 A1 | 4/2009 | Meyer | |
| 2009/0086508 A1 | 4/2009 | Bierhuizen | 362/617 |
| 2009/0095960 A1 | 4/2009 | Murayama | 257/79 |
| 2009/0101930 A1 | 4/2009 | Li | |
| 2009/0103293 A1 | 4/2009 | Harbers et al. | 362/231 |
| 2009/0103296 A1 | 4/2009 | Harbers et al. | |
| 2009/0140633 A1 | 6/2009 | Tanimoto | 313/503 |
| 2009/0141474 A1 | 6/2009 | Kolodin | |
| 2009/0175041 A1 | 7/2009 | Yuen et al. | |
| 2009/0184618 A1 | 7/2009 | Hakata et al. | |
| 2009/0190353 A1 | 7/2009 | Barker | 362/249 |
| 2009/0195186 A1 | 8/2009 | Guest et al. | 315/294 |
| 2009/0201679 A1 | 8/2009 | Konaka | 362/235 |
| 2009/0217970 A1 | 9/2009 | Zimmerman et al. | 136/252 |
| 2009/0262516 A1 | 10/2009 | Li | 362/84 |
| 2009/0273727 A1 | 11/2009 | Kubota et al. | 349/62 |
| 2009/0273924 A1 | 11/2009 | Chiang | 362/241 |
| 2009/0283779 A1 | 11/2009 | Negley et al. | 257/88 |
| 2009/0286337 A1 | 11/2009 | Lee, II | 438/27 |
| 2009/0296387 A1 | 12/2009 | Reisenauer et al. | 362/235 |
| 2009/0310368 A1 | 12/2009 | Incerti et al. | 362/326 |
| 2009/0316073 A1 | 12/2009 | Chen et al. | 349/64 |
| 2009/0322197 A1 | 12/2009 | Helbing | |
| 2009/0322208 A1 | 12/2009 | Shaikevitch | 313/503 |
| 2009/0322800 A1 | 12/2009 | Atkins | 345/690 |
| 2009/0323333 A1 | 12/2009 | Chang | |
| 2010/0014839 A1 | 1/2010 | Benoy et al. | 386/117 |
| 2010/0020547 A1 | 1/2010 | Olsson | 362/311 |
| 2010/0025700 A1 | 2/2010 | Jung et al. | |
| 2010/0026185 A1 | 2/2010 | Betsuda et al. | 315/32 |
| 2010/0027258 A1 | 2/2010 | Maxik et al. | 362/240 |
| 2010/0038660 A1 | 2/2010 | Shuja | 257/98 |
| 2010/0046231 A1 | 2/2010 | Medinis | 362/294 |
| 2010/0060144 A1 | 3/2010 | Justel et al. | 313/503 |
| 2010/0091487 A1 | 4/2010 | Shin | 362/294 |
| 2010/0096967 A1 | 4/2010 | Marinus et al. | 313/46 |
| 2010/0102707 A1 | 4/2010 | Fukuda et al. | 313/503 |
| 2010/0140655 A1 | 6/2010 | Shi | 257/99 |
| 2010/0149783 A1 | 6/2010 | Takenaka et al. | 362/84 |
| 2010/0149814 A1 | 6/2010 | Zhai et al. | 257/88 |
| 2010/0170075 A1 | 7/2010 | Kanade et al. | 29/428 |
| 2010/0177522 A1 | 7/2010 | Lee | 362/373 |
| 2010/0207502 A1 | 8/2010 | Cao et al. | 313/46 |
| 2010/0219735 A1 | 9/2010 | Sakai et al. | 313/46 |
| 2010/0232134 A1 | 9/2010 | Tran | 362/84 |
| 2010/0244729 A1 | 9/2010 | Chen et al. | 315/291 |
| 2010/0246165 A1 | 9/2010 | Diaz et al. | 362/183 |
| 2010/0259918 A1 | 10/2010 | Rains, Jr. | 362/84 |
| 2010/0264799 A1 | 10/2010 | Liu et al. | 313/46 |
| 2010/0264826 A1 | 10/2010 | Yatsuda | 315/112 |
| 2010/0314985 A1 | 12/2010 | Premysler | 313/46 |
| 2010/0327745 A1 | 12/2010 | Dassanayake | 315/35 |
| 2010/0328925 A1 | 12/2010 | Hoelen | 362/84 |
| 2011/0037368 A1 | 2/2011 | Huang | 313/46 |
| 2011/0044022 A1 | 2/2011 | Ko et al. | 362/84 |
| 2011/0058379 A1 | 3/2011 | Diamantidis | 362/296.01 |
| 2011/0068356 A1 | 3/2011 | Chiang | 257/98 |
| 2011/0074271 A1 | 3/2011 | Takeshi et al. | 313/46 |
| 2011/0074296 A1 | 3/2011 | Shen et al. | |
| 2011/0080096 A1 | 4/2011 | Dudik et al. | 315/112 |
| 2011/0080740 A1 | 4/2011 | Allen | 362/294 |
| 2011/0089804 A1 | 4/2011 | Mahalingam et al. | 313/46 |
| 2011/0089830 A1 | 4/2011 | Pickard et al. | 315/32 |
| 2011/0095686 A1 | 4/2011 | Falicoff et al. | 315/35 |
| 2011/0133222 A1 | 6/2011 | Allen et al. | 257/88 |
| 2011/0149578 A1 | 6/2011 | Niiyama | 362/294 |
| 2011/0175528 A1 | 7/2011 | Rains et al. | 315/51 |
| 2011/0176316 A1 | 7/2011 | Phipps et al. | |
| 2011/0205733 A1 | 8/2011 | Lenderink et al. | 362/231 |
| 2011/0215696 A1 | 9/2011 | Tong et al. | 313/46 |
| 2011/0216523 A1 | 9/2011 | Tong et al. | 362/84 |
| 2011/0242816 A1 | 10/2011 | Chowdhury et al. | 362/294 |
| 2011/0267835 A1 | 11/2011 | Boonekamp et al. | 362/555 |
| 2011/0273072 A1 | 11/2011 | Oki | 313/46 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van de Ven et al. | 315/35 |
| 2012/0320591 A1 | 12/2012 | Liao et al. | 362/249 |
| 2013/0049018 A1 | 2/2013 | Ramer et al. | 257/81 |
| 2013/0063945 A1 | 3/2013 | Wu et al. | 362/249 |
| 2013/0119280 A1 | 5/2013 | Fuchi et al. | 250/504 R |
| 2013/0249374 A1 | 9/2013 | Lee et al. | 313/12 |
| 2013/0293098 A1 | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1802533 | 7/2006 |
| CN | 1922286 A | 2/2007 |
| CN | 101128695 | 2/2008 |
| CN | 10126232 A | 9/2008 |
| CN | 101262032 | 9/2008 |
| CN | 101368719 A | 2/2009 |
| CN | 101641623 | 2/2010 |
| CN | 102077011 | 5/2011 |
| DE | 4311937 A1 | 10/1994 |
| DE | 10251955 | 5/2004 |
| DE | 10324190 | 1/2005 |
| DE | 102004051382 | 4/2006 |
| DE | 102011004718 | 8/2012 |
| EP | 0 559 092 A1 | 9/1993 |
| EP | 0559092 | 9/1993 |
| EP | 0876085 | 11/1998 |
| EP | 0890059 A1 | 1/1999 |
| EP | 0936682 A1 | 8/1999 |
| EP | 1058221 A2 | 12/2000 |
| EP | 1881259 | 1/2008 |
| EP | 2146135 A2 | 1/2010 |
| EP | 2469154 | 6/2012 |
| FR | 2941346 | 7/2010 |
| GB | 1423011 | 1/1976 |
| GB | 2345954 A | 7/2000 |
| GB | 2366610 | 3/2002 |
| JP | 62108598 | 5/1987 |
| JP | 63-299847 | 12/1988 |
| JP | 04-268168 | 9/1992 |
| JP | 05343572 | 12/1993 |
| JP | 06-005751 | 1/1994 |
| JP | 06005751 | 1/1994 |
| JP | H06283006 | 10/1994 |
| JP | 07-007184 | 1/1995 |
| JP | 07-161884 | 6/1995 |
| JP | 08196415 | 8/1996 |
| JP | H09265807 | 10/1997 |
| JP | 10041444 | 2/1998 |
| JP | 10-092914 | 4/1998 |
| JP | H11177149 | 7/1999 |
| JP | 11-266036 | 9/1999 |
| JP | 11266036 | 9/1999 |
| JP | H11260125 | 9/1999 |
| JP | 2000022222 | 1/2000 |
| JP | 2000173304 | 6/2000 |
| JP | 2001118403 | 4/2001 |
| JP | 2002-175721 | 6/2002 |
| JP | 2002525814 | 8/2002 |
| JP | 2003-148887 | 5/2003 |

(56) References Cited

FOREIGN PATENT DOCUMENTS

| | | |
|---|---|---|
| JP | 2003515899 | 5/2003 |
| JP | 2003312048 | 11/2003 |
| JP | 2004146225 | 5/2004 |
| JP | 2004-186109 | 7/2004 |
| JP | 2004-241318 | 8/2004 |
| JP | 2004241318 | 8/2004 |
| JP | 2004-319942 | 11/2004 |
| JP | 2005-032881 | 2/2005 |
| JP | 2005032881 | 2/2005 |
| JP | 2005108700 | 4/2005 |
| JP | 20051008700 | 4/2005 |
| JP | 2005136224 | 5/2005 |
| JP | 2005244226 | 9/2005 |
| JP | 2005277127 | 10/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | WO2006065558 | 6/2006 |
| JP | 2006525648 | 11/2006 |
| JP | 2006331683 | 12/2006 |
| JP | 2007049019 | 2/2007 |
| JP | A2007049019 | 2/2007 |
| JP | 200759930 | 3/2007 |
| JP | 2007059911 | 3/2007 |
| JP | 2007081090 | 3/2007 |
| JP | 2007184330 | 7/2007 |
| JP | 3138653 | 12/2007 |
| JP | 2008505448 | 2/2008 |
| JP | 2008508742 | 3/2008 |
| JP | 2008091140 | 4/2008 |
| JP | 2008108835 | 5/2008 |
| JP | 2008523639 | 7/2008 |
| JP | 2008187195 | 8/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009016058 | 1/2009 |
| JP | 2009016153 | 1/2009 |
| JP | 2009021264 | 1/2009 |
| JP | 2009059896 | 3/2009 |
| JP | 2009117346 | 5/2009 |
| JP | U3153766 | 8/2009 |
| JP | 2009238960 | 10/2009 |
| JP | WO2009119038 | 10/2009 |
| JP | 2009266780 | 11/2009 |
| JP | 2009277586 | 11/2009 |
| JP | 2009295299 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | 100944181 | 2/2010 |
| KR | 1020100037353 | 4/2010 |
| TW | 200505054 | 2/2005 |
| TW | 200507686 | 2/2005 |
| TW | 200527664 | 8/2005 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 200930937 | 7/2009 |
| TW | 200938768 | 9/2009 |
| TW | 200943592 | 10/2009 |
| WO | WO0124583 A1 | 4/2001 |
| WO | WO0160119 A2 | 8/2001 |
| WO | WO2004068599 | 8/2004 |
| WO | 2004100213 A2 | 11/2004 |
| WO | WO2004100213 | 11/2004 |
| WO | WO 2005/011350 | 2/2005 |
| WO | WO2005011350 | 2/2005 |
| WO | WO2006012043 | 2/2006 |
| WO | WO2006065558 | 6/2006 |
| WO | WO2008018002 | 2/2008 |
| WO | WO2008146229 | 12/2008 |
| WO | 2009028861 | 3/2009 |
| WO | WO2009052099 | 4/2009 |
| WO | 2009091562 | 7/2009 |
| WO | 2009093163 | 7/2009 |
| WO | WO2009093163 | 7/2009 |
| WO | WO2009107052 | 9/2009 |
| WO | 2009119038 | 10/2009 |
| WO | 2009125314 A2 | 10/2009 |
| WO | WO2009119038 | 10/2009 |
| WO | WO2009131627 | 10/2009 |
| WO | 2009158422 | 12/2009 |
| WO | WO2009148543 | 12/2009 |
| WO | 2010013898 A2 | 2/2010 |
| WO | WO2010012999 | 2/2010 |
| WO | WO2010013893 | 2/2010 |
| WO | WO2011100193 | 8/2011 |
| WO | 2011109098 | 9/2011 |
| WO | WO2012011279 | 1/2012 |
| WO | WO2012031533 | 3/2012 |

OTHER PUBLICATIONS

Notice of Reasons for Rejection for counterpart Japanese Patent Application No. 2008-515705 dated Feb. 22, 2011.
Canadian Examiner's report, dated: May 14, 2008 on Canadian Appl. 2395402 for Solid State Lamp.
Related Preliminary Korean Office Action, Korean Application No. 10-2004-7001033, dated Nov. 28, 2008.
Notice of Reasons for Rejection from Japanese Patent appl. No. 2011-231319, dated May 21, 2013.
Office Action from U.S. Appl. No. 13/022,490, dated Oct. 17, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.
Office Action from U.S. Appl. No. 13/028,946, dated Jul. 16, 2012.
Response to OA from U.S. Appl. No. 13/028,946, filed Oct. 8, 2012.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 12/901,405, dated Jul. 1, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013.
Response to OA from U.S. Appl. No. 13/029,005, filed Apr. 17, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,946, filed Apr. 11, 2013.
Office Action from U.S. Appl. No. 13/028,913, dated Apr. 29, 2013.
Office Action from U.S. Appl. No. 13/029,005, dated Jan. 4, 2013.
Office Action from U.S. Appl. No. 12/848,825, dated Nov. 5, 2012.
Response to OA from U.S. Appl. No. 12/848,825, filed Feb. 5, 2013.

(56) References Cited

OTHER PUBLICATIONS

Office Action from U.S. Appl. No. 13/029,005, dated Jun. 11, 2013.
Final Notice of Reasons for Rejection for counterpart Japanese Patent Application No. 2008-515705 dated Jun. 21, 2011.
ERG Materials and Aerospace Corporation, "Duocel Foam for Semiconductor Applications", pp. 1-3, Nov. 2004.
Docel Aluminum Foam, ERG, "A Basic Design Material . . . for the Imagination".
Notice of Reasons for Rejection from Japanese Patent Appl. No. 2012-543086, dated Aug. 27, 2013.
Office Action from Japanese Patent Appl. No. 2012-556064, dated Oct. 29, 2013.
Office Action from U.S. Appl. No. 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Office Action from U.S. Appl. No. 13/029,025, dated Dec. 6, 2013.
Office Action from Japanese Patent appl. No. 2012-556063, dated Jan. 28, 2014.
Comments on the Written Opinion and Amendment of the Application from European Patent appl. No. 12740244.4. dated Feb. 20, 2014.
International Search Report and Written Opinion from PCT/US2013/057712 dated Feb. 4, 2014.
Notice of Reasons for Rejection from Japanese Patent Appl. No. 2012-543086, dated Dec. 24, 2013.
Office Action from Japanese Patent Appl. No. 2012-556062. dated Dec. 20, 2013.
International Preliminary Report on Patentability and Written Opinion from PCT/US2012/044705 dated Jan. 7, 2014.
First Office Action and Search Report from Chinese Patent Appl. No. 201180022620X, dated Jul. 1, 2014.
Office Action from U.S. Appl. No. 13/358,901, dated Jul. 15, 2014.
Response to OA from U.S. Appl. No. No 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,946, dated May 27, 2014.
Office Action from U.S. Appl. No. 13/028,913, dated May 22, 2014.
Office Action from Japanese Patent Appl. No. 2012-556066, dated Mar. 14, 2014.
First Office Action from Chinese Appl. No. 201180022626.7, dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
Office Action from U.S. Appl. No. 13/029,368, dated Jun. 13, 2014.
Office Action from U.S. Appl. No. 13/018,245, dated Jun. 10, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2019.
Office Action from Japanese Patent Appl. No. 2012-556065, dated Aug. 5, 2014.
Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.
First Office Action from Chinese Patent Appl. No. 201080062056.X, dated Feb. 12, 2014.
Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Nichia Corp Part Specification, *High Brightness LEDS*, (May 1999), pp. 1-3 (NSPW300BS, NSPW312BS, etc.).
Decision of Dismissal of Amendment, Decision of Rejection from Japanese Patent Appl. No. 2011-231319. dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from U.S. Appl. No. 13/028,913, dated Nov. 4, 2013.
Patent Abstracts of Japan vol. 007, No. 236 (E-205), Oct. 20, 1983; JP 58 125855A Matsushita Denko KK, Jul. 27, 1983.
ERG Aerospace: "Duocel Aluminum Foam" Internet Article, [On Line] Jul. 1998, XP002398548, ISSN: 6.
Patent Abstracts of Japan vol. 2003, No. 12, Dec. 5, 2003, JP 2004 319942 Aoyanagi Hideki, Nov. 11, 2004.
Summons to Oral Proceedings from European Patent Appl. No. 09152962/2166580, dated Jan. 29, 2015.
First Office Action from Chinese Patent Appl. No. 2011800225832, dated Jan. 20, 2015.
First Office Action from Chinese Patent Appl. No. 2011800226214, dated Dec. 25, 2014.
Office Action from U.S. Appl. No. 13/029,068, dated Sep. 26, 2014.
Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,863, dated Nov. 10, 2014.
Decision to Grant from Japanese Appl. No. 2012-556062, dated Nov. 27, 2014.
Second Office Action from Chinese Patent Appl. No. 2011800207069, dated Dec. 5, 2014.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.

(56) References Cited

OTHER PUBLICATIONS

Decision to Grant from Chinese Patent Appl. No. 201080062056.X. dated Jul. 6, 2015.
Office Action from Taiwanese Appl. No. 101107038, dated Jul. 21, 2015.
Office Action from Taiwanese Patent Appl. No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Office Action from Japanese Patent Appl. No. 2014-122643, dated Apr. 10, 2015.
Second Office Action from Chinese Patent Appl. No. 2011800223856, dated Apr. 16, 2015.
Office Action from Taiwanese Patent Appl. No. 100107048, dated Apr. 24, 2015.
Notice of Decline of Amendments and Final Office Action from Japanese Appl. No. 2012-556065, dated Apr. 10, 2015.
Second Office Action from Chinese Patent Appl. No. 2011800223837, dated Apr. 13, 2015.
Communication from European Patent Appl. No. 13762957.2-1757, dated Apr. 30, 2015.
Office Action and Search Report from Taiwanese Patent Appl. No. 100107051, dated May 12, 2015.
Third Office Action from Chinese Patent Appl. No. 2011800207069, dated Apr. 13, 2015.
Second Office Action from Chinese Patent Appl. No. 2011800226248, dated May 4, 2015.
Office Action from Taiwanese Appl. No. 100107047, dated Jun. 5, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Appl. No. 10420724800, dated Jun. 2, 2015.
Office Action from U.S. Appl. No. 13/029,068, dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Office Action from U.S. Appl. No. 14/185,123, dated Jun. 9, 2015.
Fourth Office Action from Chinese Patent Appl No. 201180020709. 2. Dated Jan. 25, 2016.
Decision of Rejection from Chinese Patent Appl. No 201180020706. 9. dated Mar. 2, 2016.
Re-Examination Report from Japanese Patent Appl. No. 2012-556065, dated Feb. 1, 2016.
Examination Report from European Patent Appl. No. 11 709 509.1-1757 Dated Mar. 4, 2016.
Office Action from U.S. Appl. No. 13/029,025: Jan. 6, 2016.
Office Action from U.S. Appl. No. 12/430,478: Jan. 7, 2016.
Office Action from U.S. Appl. No. 13/758,763: Feb. 2, 2016.
Office Action from U.S. Appl. No. 13/029,063: Jan. 11, 2016.
Office Action from U.S. Appl. No. 12/985,275: Feb. 18, 2016.
Office Action from U.S. Appl. No. 14/453,482: Apr. 1, 2016.
Second Office Action and Search Report from Chinese Patent Appl. No. 2011800207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.
Office Action from U.S. Appl. No. 12/901,405, dated Feb. 4, 2015.
Third Office Action from Chinese Patent Appl. No. 2011800207092. dated Jul. 13, 2015.
Notice of Allowance from Japanese Patent Appl. No. 2014-122643, dated Sep. 3, 2015.
Notification of the Fourth Office Action from Chinese Patent Appl. No 2011800207169, dated Aug. 24, 2015.
Decision of Rejection from Japanese Patent Appl. No. 2012-566065, dated Aug. 18, 2015.
Second Office Action from Chinese Patent Appl. No. 2011800226267, dated Aug. 3, 2015.
Office Action from U.S. Appl. No. 13/029,025, dated Aug. 17, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,068, dated Sep. 8, 2015.
Office Action from U.S. Appl. No. 13/029,063, dated Sep. 17, 2015.
Third Office Action from Chinese Patent Appl. No. 2011800223856—translations only. original already submitted.
Official Notification and Search Report from Taiwanese Patent appl. No. 10421609300, dated Dec. 1, 2015.
Official Notification and Search Report from Taiwanese Patent appl. No. 10421621560, dated Dec. 2, 2015.
Third Office Action from Chinese Patent Appl. No. 2011800226248, dated Nov. 20, 2015.
Official Notification and Search Report from Taiwanese Patent appl. No. 10421651990, dated Dec. 7, 2015.
Notice of Issuance from Chinese Patent Appl. No. 2011800226063X, dated Dec. 10, 2015.
Official Notification and Search Report from Taiwanese Patent Appl. No. 10421595210, dated Nov. 27, 2015.
Office Action from Chinese Patent Appl. No. 201180022583.2. dated Dec. 17, 2015.
Examination from European Patent appl. No. 11 710 906.6-1757, dated Jan. 8, 2016.
Examination from European Patent appl. No. 11 710 348.1-1757, dated Jan. 8, 2016.
Office Action from U.S. Appl. No. 13/029,025; Jan. 6, 2016.
Office Action from U.S. Appl. No. 13/430,478; Jan. 7, 2016.
Office Action from U.S. Appl. No. 13/758,763; Feb. 2, 2016.
Office Action from U.S. Appl. No. 13/029,063; Feb. 11, 2016.
Office Action from U.S. Appl. No. 13/536,707, dated Nov. 16, 2015.
Office Action from U.S. Appl. No. 14/185,123, dated Nov. 17, 2015.
Office Action from U.S. Appl. No. 13/029,068, dated Dec. 3, 2015.
Office Action from U.S. Appl. No. 14/453,482, dated Oct. 1, 2015.
Office Action from U.S. Appl. No. 14/108,815, dated Nov. 5, 2015.
Examination from European Patent Appl. No. 10799139.0, dated Nov. 18, 2015.
Request for Correction from Chinese Patent Appl. No. 201180022606X, dated Nov. 12, 2015.
Third Office Action from Chinese Patent Appl. No. 2011800223856, dated Nov. 2, 2015.
US 5,419,205, 05/1995, Huebner (withdrawn)*

* cited by examiner

HIGH POWER SOLID-STATE LAMP

BACKGROUND OF THE INVENTION

1. Field of the Invention

This invention relates to high power semiconductor devices and more particularly, to improved heat sinks for heat management of high power semiconductor light emitters and power devices.

2. Description of the Related Art

Light emitting diodes (LEDs) are an important class of solid-state devices that convert electric energy to light energy and generally comprise an active layer of semiconductor material sandwiched between two oppositely doped layers. When a bias is applied across the doped layers, holes and electrons are injected into the active layer where they recombine to generate photons and phonons. Photons are useful because they provide radiative recombination or light, which is typically emitted omnidirectionally from the active layer and from the surfaces of the LED.

LEDs have the potential to provide replacement for longstanding illumination technologies such as incandescent and fluorescent lighting. In comparison to these mature technologies, LEDs are longer-lasting, physically more rugged, use less power, and are more efficient. Historically, however, LEDs have lacked brightness comparable to incandescent, fluorescent or vapor-discharge lights and thus these older technologies have continued to occupy the field. Only recently, have LEDs begun to make inroads into commercial lighting applications, with most of these being in smaller applications such as flashlights, intersection signal lights and automotive tail lights.

Despite generating light more efficiently, conventional LEDs dissipate approximately 50-70% of their input power as heat, which is generated due to the finite series resistance of LEDs in operation and to non-radiative recombination in LEDs with quantum efficiency less than 100%. The wall plug efficiency of LEDs determines their energy conversion efficiency. It is calculated as the ratio of the light output power emitted by the LED and the electrical power required to generate that light. For example, a relatively efficient LED has a series resistance of 1 ohm, an operating voltage of 4.0 volts at an operating current of 1 ampere and a wall plug efficiency of approximately 30%. The input power for this LED at 1 ampere is 4 watts. At 30% wall plug efficiency the LED emits 1.2 watts radiant energy as light. The energy balance of 2.8 watts is converted to heat. This level of heat dissipation can cause LEDs to operate at relatively high temperatures.

As LEDs are more frequently being used for commercial applications, it will be necessary for them to produce a higher luminous flux. These high luminous flux devices will be required to produce illumination that reaches several hundred to a few thousand lumens. One way to increase a devices luminous flux is to increase the level of the input power applied to the devices. To produce the desired luminous flux, the input power can be increased up to several watts to tens of watts, which will in turn cause the LEDs or LED arrays to operate at higher temperatures. Higher operating temperatures cause the device quantum efficiency to decrease. Further, the device's lifespan can also be decreased due to accelerated materials degradation.

One way to decrease the operating temperature of an LED is to mount it in thermal contact with a heatsink. For high power LEDs the operating temperature can be reduced to an acceptable level using large heat sinks that are typically fabricated from a bulk metal, such as aluminum. The heat sink operates as a high thermal conductivity path to conduct heat away from the LED and eventually dissipates the heat to the ambient. Typical heat sinks have features such as fins that increase the heat sink's surface to provide for greater convection heat exchange with the ambient air. These larger heat sinks can consume an unacceptable amount of space and can also be prohibitively heavy, expensive and complicated to manufacture. Further, bulky heat sinks reduce the flexibility in the design of LED systems.

SUMMARY OF THE INVENTION

One embodiment of an optical device according to the present invention comprises a solid state light source and a first heat sink positioned in thermal contact with the light source. Heat from the light source transmits into the first heat sink. The first heat sink at least partially comprises a porous material region of a thermally conductive material in a 3-dimensional pore structure. The surfaces of the pores in the pore structure provide an increased surface area for heat to dissipate into the ambient air compared to typical bulk heat sinks.

One embodiment of a lamp according to the present invention comprises a solid state light source mounted to a circuit board. A reflector is also mounted to the circuit board to reflect at least some of the light from the light source into directional light emission. Contacts are included for providing electrical power to the solid state light source. First and second heat sinks are included each of which at least partially comprises a porous material region made of a thermally conductive material in a 3-dimensional pore structure. The first heat sink is affixed to the reflector and the second heat sink is affixed to the circuit board.

One embodiment of a high power semiconductor component structure according to the present invention comprises a semiconductor device arranged to operate in response to an electrical signal, with the device heating up during operation in response to the electrical signal. A first heat sink is positioned in thermal contact with the semiconductor device such that heat from the device transmits into the first heat sink. The first heat sink at least partially comprises a porous material region of a thermally conductive material in a 3-dimensional pore structure with the surfaces of the pore structure providing surface area for heat to dissipate into the ambient air.

These and other further features and advantages of the invention would be apparent to those skilled in the art from the following detailed description, taken together with the accompanying drawings, in which:

DETAILED DESCRIPTION OF THE INVENTION

The present invention provides improved heat management for high-power solid state light emitters and power devices by utilizing one or more heat sinks that at least partially comprise porous structures made of high thermal conductivity material.

Many different types of porous material can be used including metals such as porous aluminum or copper, or inorganic materials such as carbon or porous ceramics. The pores in the material should interconnect to facilitate an effective convective heat exchange with the ambient, and the thickness of the material and pore size should provide for optimum conductive heat transfer through the pore structure without entrapping pockets of air within the material, and with the pores providing a continuous air channel to the ambient. The porous material should be arranged in thermal contact with the particular emitter or power device so that heat conducts from the device into and throughout the porous material (foam). The porous material has a greater surface area in contact with the surrounding ambient by virtue of the pore surfaces that the 3-dimensional pore structure provides. This increased surface area provides for more opportunity for heat to dissipate by convection and radiation to the ambient compared to conventional 2- and 3-dimensional solid heat sinks.

The porous material can have different pore designs depending on its application to tailor the heat exchange capability and convection characteristics to the ambient condition, i.e the temperature difference between ambient and maximum allowable junction temperature of the emitter or power device. The material can also be designed to tailor it to whether the ambient is air or liquid and whether the ambient is still or flowing, such as air flowing under the force of a fan. The porous material can also have sufficient density to provide mechanical support, and in a preferred embodiment it can be easily cut or formed to different shapes. In one embodiment of a lamp according to the present invention, the porous material can assume the shape of reflector elements of the lamp, or in the case of a power device can be combined with circuit boards.

Another advantage of porous material arranged according to the present invention is that it can be lighter and can consume less space than bulk heat sinks. This can be an important consideration in certain applications. As solid state emitters replace conventional lamps they are expected to be packaged such that they are compatible with standard light sockets. Existing sockets, however, do not provide significant structures to facilitate heat dissipation into the socket, surrounding ambient or surrounding structures. In different embodiments, shaped porous material heat sinks can be included with solid state packages in the same form and fit of the lamp and optical elements without significantly increasing the size or weight of the package. This would allow the package to have the appropriate thermal management while still allowing it to be compatible with standard sockets.

Figure 1:
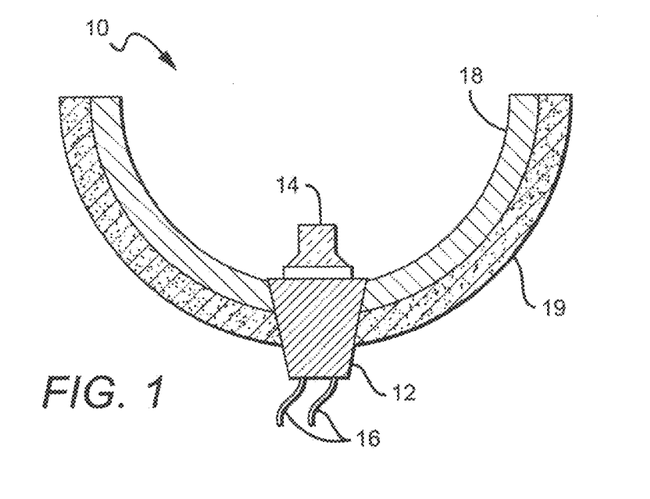
FIG. 1 is a simplified sectional view of one embodiment of a lamp according to the present invention having a porous material heat sink region shaped to fit around a reflector.

FIG. 1 shows one embodiment of solid state lamp 10 according to the present invention, which comprises a housing 12 for holding a solid state light emitter 14. Emitter 14 is preferably a high power LED or an array of high power LEDs, but can also comprise other emitters such as one or more solid state lasers, organic light emitting diodes, or lamps. In the embodiments having an array of LEDs, each LED can emit light at the same or different wavelengths and when emitting different wavelengths, light from the LEDs can combine to produce different wavelengths of light. For example, an array of LEDs can be used that emits red, green and blue light that combines to produce white light.

LEDs and solid state lasers typically include an active region sandwiched between two oppositely doped layers that are either doped p-type or n-type. The p- and n-type layers have respective contacts and an electrical signal can be applied across the contacts so that a current is injected into the active region to produce light emission. A solid state laser typically includes mirrors and a resonant cavity to provide stimulated emission and, consequently, amplification of the generated light such that a coherent light is emitted.

The fabrication details of LEDs and other solid state light emitters are known and are only briefly discussed. The emitters can be fabricated from different material systems such as the Group III nitride based material systems. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN.

The emitters are typically formed on a substrate, with a suitable substrate being conductive silicon carbide. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in U.S. Pat. Nos. Re. 34,861; 4,946,547; and 5,200,022.

The emitters can be fabricated using many known methods, with suitable methods being fabrication by Chemical Vapor Deposition (CVD), Molecular Beam Epitaxy (MBE) or Metal Organic Chemical Vapor Deposition (MOCVD).

Referring again to FIG. 1, electrical connectors 16 extend through housing 12 and are in electrical contact with emitter 14. Electrical connectors 16 can be electrically coupled to control circuitry (not shown), which generates the appropriate electrical power for emitter 14. The power is conducted from the control circuitry to the emitter 14 over the connectors 16 with the emitter 14 generating light in response to the power supplied through the conductors 16.

Lamp 10 also comprises a reflector 18 to reflect light from emitter 14 so that lamp 10 provides more directional light emission. The reflector is mounted to the housing 12 near the surface holding the emitter 14, although in other embodiments the reflector 18 can be mounted in other ways and in other locations. Reflector 18 is typically reflective at the wavelengths of the LED emission so that light emitted toward the reflector is reflected so that it contributes to the light emission of lamp 10. Reflector 18 can be made of many different materials, with suitable materials being aluminum (Al) or silver (Ag).

The lamp 10 can also comprise an encapsulating material (not shown) in the reflector 18 and covering the emitter 14 for protection. The encapsulating material can also include a conversion material such that all or some of the emitted light passes through the conversion material and is downconverted to a different wavelength of light. The lamp 10 can then emit the downconverted wavelength of light or a combination of the emitter and downconverted wavelengths of light. Alternatively, the encapsulating material can be covered by the conversion material to downconvert all or some of the emitter's light.

The lamp 10 can further comprise a lens (not shown) to focus or more evenly distribute light emitted by emitter 14. The lens typically includes a material that is transparent to the wavelengths of interest. The lens or encapsulating material described above can also include a scattering material, with particles sized to scatter the light from the emitter 14 to more evenly distribute the light.

The lamp 10 can operate with high power emitters 14 that typically operate at higher temperatures as discussed above. As discussed above, this increase in temperature can decrease the emitter's quantum efficiency and can reduce its lifespan. With these types of emitters it is important to efficiently draw heat away and dissipate the heat to keep the operating temperature as low as possible. To accomplish this, a heat sink 19 is included with lamp 10 and in FIG. 1, the heat sink 19 is provided on the outside surface of the reflector 18. According to the present invention, the heat sink 19 at least partially comprises a porous material with high thermal conductivity made of the materials described above, although as shown comprises all porous material. Porous materials provide a more efficient heat sinking capability to emitter 14 so that it can operate at lower temperatures compared to operation without a heat sink or with a solid heat sink. In this way, the temperature of the emitter 14 at a given power level is reduced because heat is more efficiently transferred away from emitter 14 more efficiently.

The heat sink 19 is shaped to fit around reflector 18 and is bonded to the outside surface of the reflector 18, preferably by a conductive adhesive such as a carbon based adhesive or conductive tape. The reflector 18 is made of metal, which efficiently transmits heat such that heat from the emitter spreads through the reflector 18 to the heat sink 19, where it is dissipated into the ambient.

Figure 2:
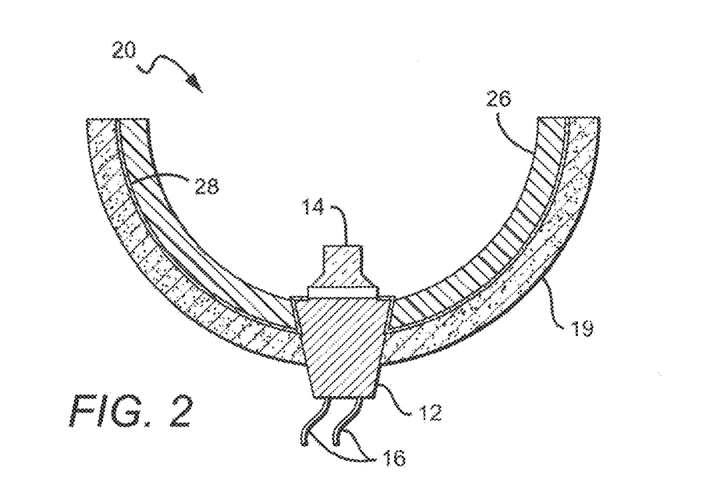
FIG. 2 is a simplified sectional view of another embodiment of a lamp according to the present invention having a porous material heat sink region shaped to fit around a reflector.

FIG. 2 shows another embodiment of a lamp 20 according to the present invention that has many of the same features as the lamp 10 in FIG. 1, and the same reference numerals are used for the same or similar features. The lamp 20 includes a housing 12, emitter 14, connectors 16, and porous material heat sink 19. The reflector 26, however, can be made of plastic coated with a reflective metal, such as aluminum (Al) or silver (Ag). Typical plastics are not efficient at conducting heat and to assist in spreading the heat from the emitter 14 a heat conductive path 28 should be included from the emitter 14 (or housing 12) and the heat sink 19. In one embodiment, the conductive path 28 comprises a heat conductive layer arranged on the outside surface of the reflector 26, between the heat sink 19 and the reflector 26. Heat from the emitter 14 spreads throughout the layer and into the heat sink 19 where the heat can dissipate into ambient air.

In one embodiment of lamps 10 and 20 the porous material in the heat sink 19 comprises commercially available Doucel® Foam from ERG Materials and Aerospace Products, which can be used with metal or plastic reflectors. Doucel® Foam is available in different materials such as aluminum, reticulated vitreous carbon, and silicon carbide of different densities of pores. The heat sink 19 preferably comprises Doucel® Foam made of aluminum.

The dimensions of the porous material and its porosity can be chosen to provide optimum heat transfer. The porosity (pores per linear inch) is the ratio of the volume of the pores in a material to the volume of the whole material. The thermal conductivity of a material is a measure of the quantity of heat that passes per unit time through a unit area, subject to a unit temperature gradient. The thermal conductivity (k) is accordingly proportional to the heat flow rate and inversely proportional to the area and temperature gradient. The porous material can also be anodized or otherwise darkened or coated with a dark colored material to provide better radiative heat transfer.

Figure 3:
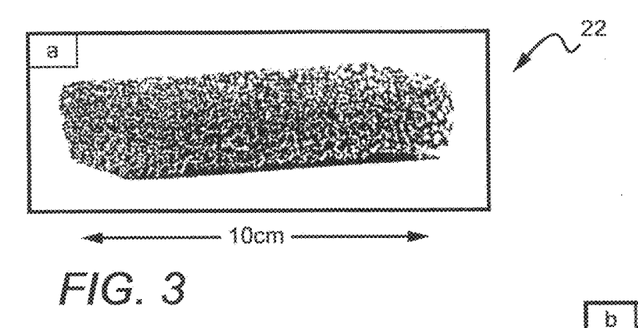
FIG. 3 is a perspective view photograph of one embodiment of a porous material that can be used in heat sinks according to the present invention.
Figure 4:
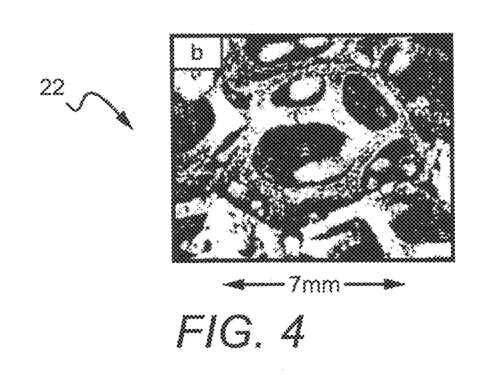
FIG. 4 is a close-up photograph of the porous material in FIG. 3.
Figure 5:
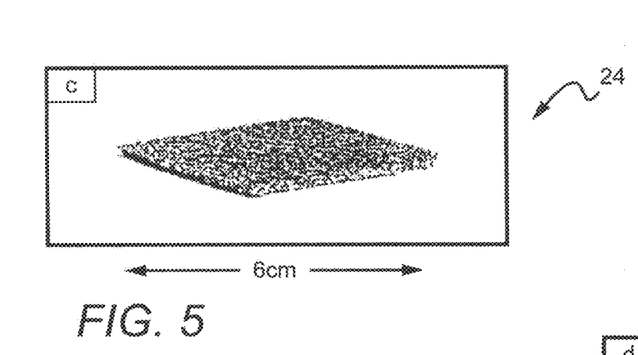
FIG. 5 is a perspective view photograph of another embodiment of a porous material that can be used in heat sinks according to the present invention.
Figure 6:
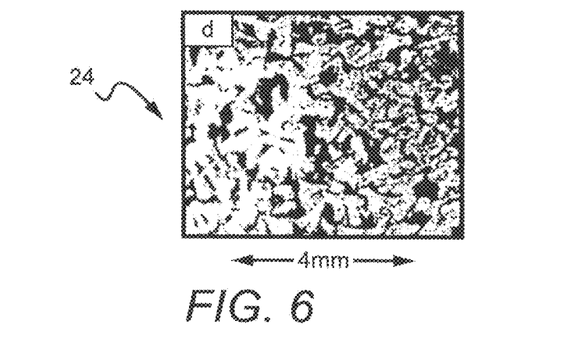
FIG. 6 is a close-up photograph of the porous material shown in FIG. 5.

FIGS. 3-6 show two embodiments of Duocel® Foam that can be used as heat sinks according to the present invention, although it is understood that many other porous materials can also be used. FIG. 3 shows one embodiment of a aluminum porous material 22 that is 10 cm long and comprises an open cell foam (t=6106) alloy with a porosity of approximately 92% and pore diameter of approximately 6 mm (k≈200 Wm$^{-1}$K$^{-1}$). FIG. 4 shows a close-up view of the porous material 22 in FIG. 3. FIG. 5 shows another embodiment of a porous material 24 according to the present invention that is 6 cm long that is compressed by a factor of four compared to material 22 in FIGS. 3 and 4, and as a result, is denser. FIG. 6 is a close up view of the material 24 shown in FIG. 5 showing the shape of the individual pores being altered compared to the material 22 in FIGS. 3 and 4, as a result of the compression.

Figure 7:
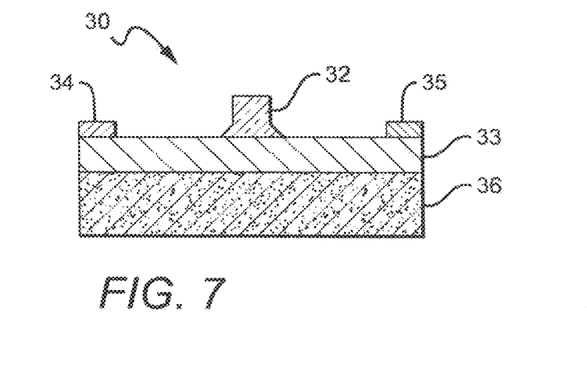
FIG. 7 is a simplified sectional view of another embodiment of an lamp according to the present invention with a porous material heat sink on its circuit board.

As discussed above, the porous material can be shaped to fit different devices and can be arranged in different ways. FIG. 7 is a sectional view of one embodiment of an optical device 30 according to the present invention utilizing a flat porous material region as its heat sink. Device 30 generally comprises emitter 32 that is preferably one or more LEDs, but can be other devices as described above. The emitter 32 is mounted to a printed circuit board (PCB) 33 using known mounting methods, including but not limited to pin or surface mount methods. Alternatively, the emitter 32 can also be mounted on a lead frame construction (not shown). PCB 33 can also hold electrical circuitry (not shown) coupled to emitter 32, such as electrical circuitry to provide power for light emission or to protect emitter 32 from large electrical signals such as electrostatic shock. The PCB 33 can also comprise first and second electrical contacts 34, 35 for applying an electrical signal directly to the emitter 32, or to the electrical circuitry on the PCB.

A heat sink 36 is positioned adjacent to PCB 33, preferably on the surface of the PCB 33 opposite the emitter 32, with the heat sink 36 in thermal contact with the PCB 33. Similar to the heat sink 19 in lamp 20, heat sink 36 at least partially comprises a porous material made of the same materials as described above for heat sink 19. Doucel® can be provided in sheet form such that it can be conveniently cut to the size of and attached to PCB 33, with heat from the emitter spreading into the heat sink 36. The heat sink 36 is preferably bonded to the PCB 33 using a heat conductive adhesive such as a carbon epoxy or thermal tape. Alternatively the heat sink can be brazed to the PCB 33 using known techniques.

PCB 33 can be made of a variety of materials such as ceramic (aluminum oxide, aluminum nitride), metal (aluminum, copper), organic foils or other materials so that it allows for sufficient heat conduction from the emitter 32 to the porous heat sink 36. Alternatively, heat conductive vias (not shown) can be included running through the PCB to provide an efficient path for heat to conduct from the emitter 32 to the heat sink 36. A heat spreading layer can then be included between the vias and the heat sink to spread the heat throughout the heat sink 36. Device 30 can also include an epoxy to protect the emitter 32, and can also include a lens positioned over emitter 32. The lens and the epoxy can include conversion materials and scattering particles as described above for FIG. 1.

Figure 8:
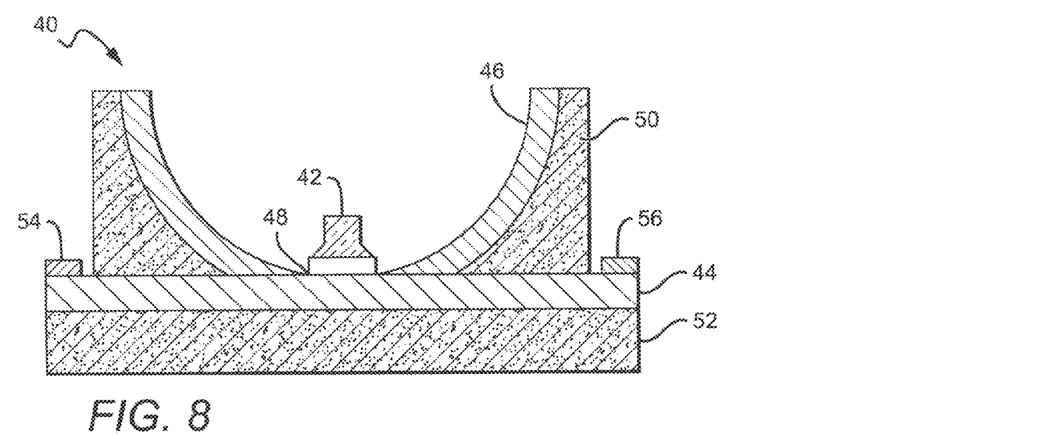
FIG. 8 is a simplified sectional view of another embodiment a lamp according to the present invention with porous material heat sinks on a circuit board and reflector.

FIG. 8 is a sectional view of another embodiment of a lamp 40 according to the present invention utilizing more than one heat sink for thermal management. Like the embodiments above, lamp 40 comprises an emitter 42 mounted on a PCB 44 by conventional mounting methods discussed above. Lamp 40 also comprises a reflector 46 mounted on the PCB 44, with the reflector 46 having an opening 48 at its base, with the emitter 42 arranged within the opening 48. Like above, reflector 46 is arranged to reflect the emitter light to provide a more directed light. Reflector 46 can be made of many different materials, including but not limited to a metal or plastic. In those embodiments wherein the reflector is plastic, a heat spreading layer can be included between the outside surface of the reflector 46 and the first heat sink 50 to spread heat from the emitter 42. The emitter also comprises first and second contacts 54, 56 for applying a power signal to the emitter 42.

A first heat sink 50 is included on the outside surface of and in thermal contact with the reflector 46, with the heat sink 50 being at least partially made of a porous material as discussed above. The heat sink 50 can be mounted to the reflector using the materials and techniques discussed above, and can have an approximately uniform thickness throughout similar to heat sink 19 described above and shown in FIGS. 1 and 2. Alternatively, the outside surface of the heat sink 50 can be approximately vertical as shown in FIG. 8, with the thickness of the heat sink 50 increasing toward the PCB 44. The bottom surface of the heat sink 50 can be in thermal contact with the top surface of the PCB 44 to aid in dissipating heat from the PCB 44. The volume of heatsink 50 is greater than the volume of heatsink 19 shown in FIGS. 1 and 2, so it can dissipate more heat by providing a larger pore surface area for heat to dissipate into the ambient. The exact size and shape of heatsink 19 can be chosen so that it can fit into a support structure, such as a light display or illumination source.

Lamp 40 further comprises a second heat sink 52 which is mounted to the surface of the PCB 44 opposite the emitter 42 and reflector 46 using the methods described above, and is arranged similar to the heat sink 36 in FIG. 7. Portions of PCB 44 are sandwiched between first and second heat sinks 50 and 52. Heat conductive vias can also be included through the PCB 44 and a heat conductive layer can be included between the second heat sink 52 and the PCB in thermal contact with the vias. In other embodiments the porous material heat sinks can extend out from emitter 44 both vertically and laterally to provide more surface area and, consequently, more efficient heat dissipation. By including two heat sinks 50, 52 the thermal contact with the emitter is improved and heat can be more efficiently transferred to the ambient air.

As discussed above, the heat sinks 50, 52 according to the present invention at least partially comprise a porous material, and in the embodiments discussed above the heats sinks were made of the porous material having the same pore density throughout. In other embodiments the heat sinks can comprise layers of different porous material density or can be used with layers/sections of solid heat sink material.

Figure 9:
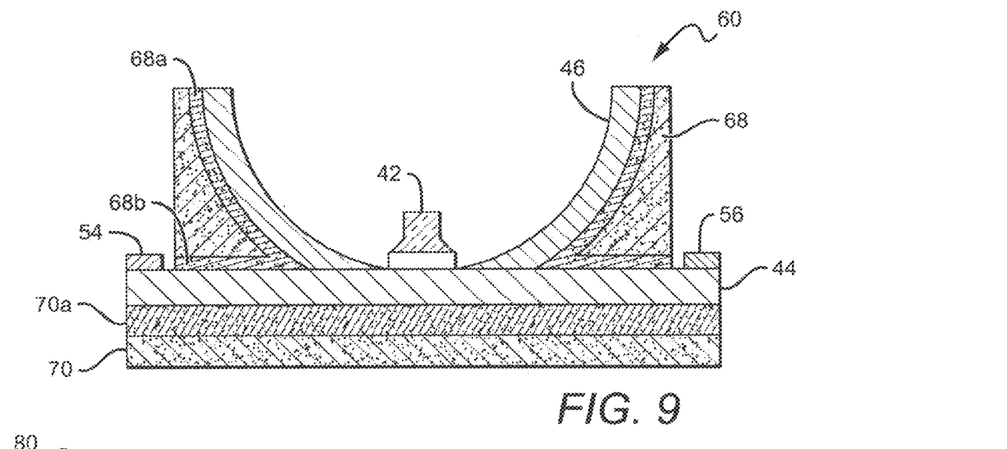
FIG. 9 is a simplified sectional view of another embodiment a lamp according to the present invention with porous material heat sinks on the circuit board and reflector.

FIG. 9 is a sectional view of another embodiment of optical device/lamp 60 according to the present invention that is similar to the lamp 40 in FIG. 8 and uses the same reference numerals for similar features. The primary difference in lamp 60 is that the heat sinks comprise composite porous heat sinks with a graded pore structure. Lamp 60 includes an emitter 42 mounted on a PCB 44, a reflector 46 mounted on the PCB 44 to reflect light from the emitter 42, and contacts 54, 56. A first heat sink 68 is included on the outside surface of the reflector 46 and a second heat sink 70 is included on the surface of the PCB 44 opposite the emitter 42 and reflector 46. It is understood, however, the heat sinks can be arranged in many different ways and additional heat sinks can be included according to the present invention.

The first and second heat sinks 68, 70 have respective inside layers/portions 68a, 70a that are made of a higher density, less porous material compared to the remainder of the heat sinks. By having an inside layer of higher density less porous material heat can be more effectively conducted away from the reflector 46 or PCB 44, as the case may be, through the higher density porous material and then conducted into the lower density porous material where it can be dissipated into the ambient air. Although the heat sinks are shown with two different density layers/portions of porous material, alternative heat sinks can have three or more different density layers. The multiple density layers can be made of one compositely formed heat sink or can be made of multiple layers of different densities bonded together, and in other embodiments, the inside layer can comprise a solid heat sink material or a less porous material. The first heat sink 68 can also have a less porous layer 68b of porous material at its surface adjacent to the PCB 44.

Figure 10:
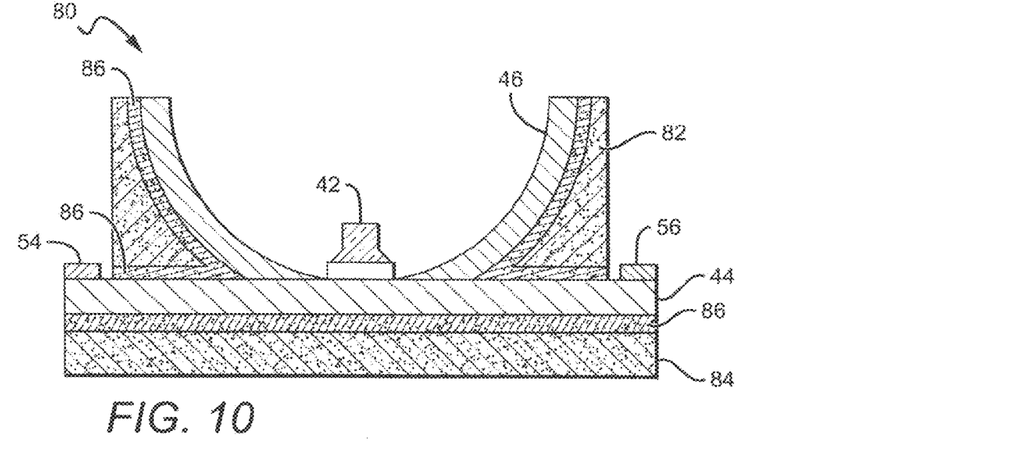
FIG. 10 is a simplified sectional view of another embodiment a lamp according to the present invention with porous material heat sinks on a circuit board and reflector.

FIG. 10 shows another embodiment of a lamp 80 according to the present invention, that is similar to the lamp 40 in FIG. 8. The lamp 80 comprises an emitter 42 and reflector 46 mounted on a PCB 44, with contacts 54, 56 to apply a signal to the emitter 42. The lamp 80, however, comprises different first and second heat sinks 82, 84. Instead of having a layer of higher density material at the inside surface of the heat sinks, a thermally conductive paste 86 is infused into the surface of one or both of the heat sinks 82, 84 filling the pores of the heat sinks partially with the paste. This results in the portion of the heat sinks 82, 84 with the paste taking on the characteristics of a heat spreader, while the remainder of the heat sinks 82, 84 retain the characteristics of the 3-dimensional porous material. It is understood that the paste can be infused into the porous material heat sink at many different locations pursuant to the invention other than as shown in FIG. 10. The paste can be filled with aluminum nitride, zinc oxide carbon or other thermally conductive materials to obtain the desired conductivity and heat spreading. Further, it is understood that the paste can have a consistency tailored to the LED application requirements. For instance the paste can have adhesive properties or can be cured to provide mechanical stability.

Figure 11:
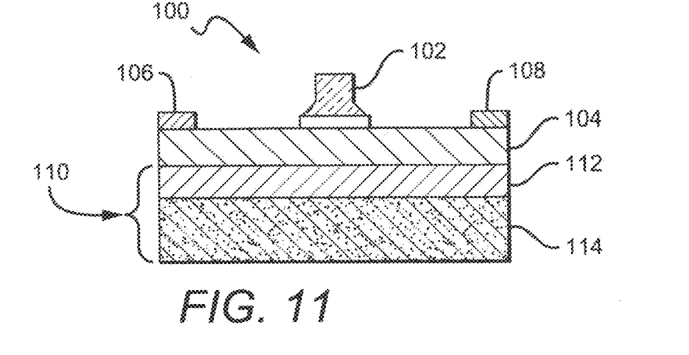
FIG. 11 is a simplified sectional view of another embodiment of a lamp according to the present invention having a porous and solid metal heat sink.

The porous heat sink can also be used in conjunction with a solid heat conductive heat sink. FIG. 11 shows another embodiment of a lamp 100 similar to the lamp 30 shown in FIG. 7 and described above. The lamp 100 comprises a emitter 102 mounted to PCB 104, with contacts 106, 108 to apply a power signal to the emitter 102. The lamp also comprises a composite heat sink 110 comprising a first section 112 of solid heat conductive material, such as a metal and a second section 114 of a porous heat conductive material. This arrangement can efficiently draw heat away from the emitter 102 and PCB 104 through the first section 112 which then spreads the heat into the second section 114 to dissipate into the ambient air. The type of composite heat sink 110 can be used in different devices and different locations for heat management, such as mounted to a lamp reflector.

Figure 12:
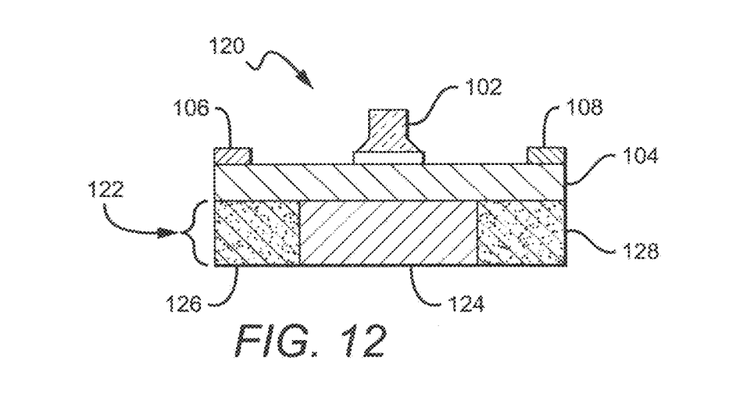
FIG. 12 is a sectional view of another embodiment of a lamp according to the present invention having a porous and solid metal heat sink.

FIG. 12 shows a lamp 120 similar to the lamp 100 in FIG. 11 and comprises a emitter 102, PCB 104 and contacts 106, 108. Instead of having a horizontal orientation, the heat sink 122 has a vertical orientation with a first section 124 of solid heat conductive material being included below the emitter 102 and second and third porous material sections 126, 128 being below the remainder of the PCB 104. This arrangement can be useful in applications where heat is generated primarily from a small area. Heat from the area can be conducted into the first section 124 and dissipate into the second and third sections 126, 128. It is understood that this arrangement can be used in other ways and can include additional portions of solid or porous materials that can extend beyond the PCB 104.

Figure 13:
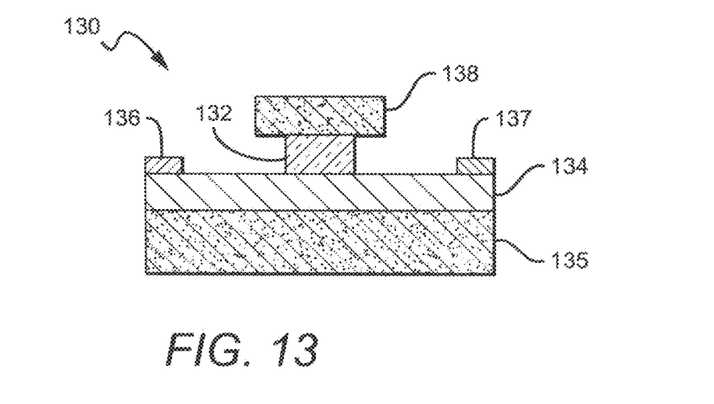
FIG. 13 is a sectional view of one embodiment of a power device according to the present invention having porous material heat sinks.

As mentioned above, the heat sinks according to the present invention can also be used with power devices including but not limited to transistors, diodes, etc. FIG. 13 shows one embodiment of a power component 130 utilizing porous heat sinks. The component 130 comprises a power device 132 mounted on a PCB 134 with contacts 136, 137 for applying and reading signals applied to the device 132. A first heat sink 135 is included on the surface of the PCB opposite the device 132 and because light emission is not a concern, a second heat sink 138 can be included on the device 132. Just as with the heat sinks described above, heat sinks 135, 138 are arranged to draw heat away from the device 132 to dissipate it into the ambient air. The different embodiments of the heat sinks also described above can also be used with power devices.

Although the present invention has been described in considerable detail with reference to certain preferred configurations thereof, other versions are possible. In some embodiments, the porous material can be shaped to include other features such as fins. Other structures providing the same advantages of porous materials can also be used, such as micro-fins or needles coated around the lamp body or nanometer size or structured needles or coatings. The materials and structures described above can take many different shapes. The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An optical device, comprising:
a solid state light source;
a reflector positioned to reflect light from said light source into directional light emission, heat from said light source at least partially transmitting into said reflector; and
a first heat sink mounted to said reflector positioned in thermal contact with said light source such that heat from said light source transmits into said first heat sink, said first heat sink comprising a thermally conductive conformable porous material layer adjacent said light source, said porous material layer comprising a 3-dimensional pore structure comprising interconnected pores, with the surfaces of said pore structure providing increased surface area for heat to dissipate into the ambient compared to bulk heat sinks, said porous material layer further comprising a graded porous material region wherein part of said porous material region comprises a higher density pore structure than the remainder of said region, said first heat sink shaped to fit around said reflector, wherein said reflector is configured to spread heat from said light source throughout said first heat sink;
wherein said reflector comprises a reflective metal and wherein said reflector is affixed to said first heat sink.

2. The device of claim 1, further comprising a circuit board, said light source mounted to said circuit board, and said first heat sink mounted to said circuit board such that heat from said light source transmits at least partially into said first heat sink.

3. The device of claim 1, further comprising a circuit board and a reflector, said light source and reflector mounted to said circuit board such that said reflector reflects at least some of said light from said emitter into directional light emission, and said first heat sink mounted to said circuit board such that heat from said light source transmits into said first heat sink.

4. The device of claim 3, further comprising a second heat sink mounted to said circuit board such that the light source at least partially transmits heat through said circuit board into said second heat sink.

5. The device of claim 1, wherein said porous material region further comprises a dark coating to increase radiation of heat into the ambient.

6. The device of claim 1, wherein any higher density porous region of said heat sink comprises a thermal paste infused into a portion of the porous material.

7. The device of claim 1, wherein the porous material layer comprises dimensions and porosity that provide for an optimum conductive heat transfer.

8. The device of claim 1, wherein the first heat sink is provided on an outside surface of the reflector.

9. The device of claim 1, wherein the first heat sink is bonded to an outside surface of the reflector.

10. The device of claim 9, wherein the first heat sink is bonded to the outside surface of the reflector by a conductive adhesive.

11. The device of claim 1, further comprising a heat conductive path between the first heat sink and the reflector.

12. The device of claim 1, wherein the reflector is affixed to the first heat sink by a thermally conductive adhesive.

13. An optical device, comprising:
a solid state light source; and
a first heat sink positioned in thermal contact with said light source such that heat from said light source transmits into said first heat sink, said first heat sink comprising a porous material layer adjacent said light source, said porous material comprising a thermally conductive material with a 3-dimensional pore structure comprising interconnected pores, with the surfaces of said pore structure providing increased surface area for heat to dissipate into the ambient compared to bulk heat sinks, said heat sink comprising a graded porous material region wherein part of said porous material region comprises a higher density pore structure than the remainder of said region.

14. The device of claim 13, wherein any higher density porous region of said heat sink comprises a solid metal.

15. A lamp, comprising:
a solid state light source mounted to a circuit board;
a reflector mounted to said circuit board to reflect at least some of the light from said light source into directional light emission;

contacts for providing electrical power to said solid state light source; and first and second heat sinks, each of which comprises a layer of thermally conductive conformable porous material in a 3-dimensional pore structure comprising interconnected pores, said porous material layer comprising a graded porous material region wherein part of said porous material region comprises a higher density pore structure than the remainder of said region, said first heat sink shaped to fit around said reflector and said second heat sink affixed to and covering said circuit board, wherein said reflector is configured to spread heat from said light source throughout said first heat sink, wherein said first and second heat sinks are on opposite sides of said circuit board;

wherein said reflector comprises a reflective metal and wherein said reflector is affixed to said first heat sink.

16. The lamp of claim 15, wherein said reflector is made of a metal.

17. The lamp of claim 15, wherein at least a portion of the circuit board is between the first heat sink and the second heat sink.

18. The lamp of claim 15, wherein the porous material comprises dimensions and porosity that provide for an optimum conductive heat transfer.

19. The lamp of claim 15, wherein the first heat sink is provided on an outside surface of the reflector.

20. The lamp of claim 15, wherein the first heat sink is bonded to an outside surface of the reflector.

21. The lamp of claim 20, wherein the first heat sink is bonded to the outside surface of the reflector by a conductive adhesive.

22. The lamp of claim 15, further comprising a heat conductive path between the first heat sink and the reflector.

23. The lamp of claim 15, wherein the reflector is affixed to the first heat sink by a thermally conductive adhesive.

24. A lamp, comprising:
a solid state light source mounted to a circuit board;
a reflector mounted to said circuit board to reflect at least some of the light from said light source into directional light emission;
contacts for providing electrical power to said solid state light source; and
first and second heat sinks, each comprising a conformable porous material region made of a thermally conductive material in a 3-dimensional pore structure, wherein part of said porous material region comprises a graded region, part of said graded region comprising a higher density pore structure than the remainder of said graded region, said first heat sink shaped to fit around said reflector and said second heat sink affixed to said circuit board, said reflector comprising reflectively coated plastic and a heat conductive path comprising a heat conductive layer between said reflector and said first heat sink for heat to transmit from said light source and spread into and throughout said first heat sink through said heat conductive path, wherein said first and second heat sinks are on opposite sides of said circuit board.

25. The lamp of claim 24, wherein heat from said light source transmits into said second heat sink through said circuit board.

26. The lamp of claim 24, further comprising one or more heat conductive vias through said circuit board, said vias conducting heat from said emitter to said second heat sink.

27. The lamp of claim 26, further comprising a heat conductive layer between said second heat sink and said circuit board, said conductive layer in thermal contact with said vias and said second heat sink, and spreading heat from said vias across said heat sink.

28. The lamp of claim 24, wherein said porous material region further comprises a dark coating to increase radiation of heat into the ambient.

29. The device of claim 24, wherein at least part of the non-porous region of said heat sink comprises a solid metal.

30. The device of claim 24, wherein at least part of the non-porous region of said heat sink comprises a thermal paste infused into a porous material.

31. The device of claim 24, wherein said light source comprises one from the group consisting of a light emitting diode, a plurality of light emitting diodes, a solid state laser, and a plurality of solid state lasers.

32. The lamp of claim 24, wherein at least a portion of the circuit board is between the first heat sink and the second heat sink.

33. The lamp of claim 24, wherein the porous material region comprises dimensions and porosity that provide for an optimum conductive heat transfer.

34. The lamp of claim 24, wherein the first heat sink is provided on an outside surface of the reflector.

35. The lamp of claim 24, wherein the first heat sink is bonded to an outside surface of the reflector.

36. The lamp of claim 35, wherein the first heat sink is bonded to the outside surface of the reflector by a conductive adhesive.

37. The lamp of claim 24, wherein the reflectively coated plastic is coated with a reflective metal.

38. A lamp, comprising:
a solid state light source mounted to a circuit board;
a reflector mounted to said circuit board to reflect at least some of the light from said light source into directional light emission;
contacts for providing electrical power to said solid state light source; and
first and second heat sinks, each comprising a porous material region made of a thermally conductive material in a 3-dimensional pore structure, said first heat sink affixed to said reflector and said second heat sink affixed to said circuit board, wherein said reflector is made of reflectively coated plastic, and further comprising a heat conductive path between said reflector and said first heat sink for heat to transmit from said light source into first heat sink through said heat conductive path, said porous material region of said first or second heat sinks being graded such that part of said porous material region comprises a higher density pore structure than the remaining of said region.

39. A high power semiconductor component structure, comprising:
a semiconductor device configured to operate in response to an electrical signal, said device heating up during operation in response to said electrical signal;
a thermally conductive metal layer;
a first heat sink mounted to said thermally conductive metal layer positioned in thermal contact with said semiconductor device such that heat from said device transmits into said first heat sink, said first heat sink comprising a conformable porous material region, said porous material region comprising a thermally conductive material in a 3-dimensional pore structure comprising interconnected pores with the surfaces of said pore structure providing surface area for heat to dissipate into the ambient, wherein part of said porous material region comprises a graded region, part of said graded region comprising a higher density pore structure than the remainder of said graded region, wherein said porous material region is thermally conductive, said first heat sink shaped to fit around said thermally conductive metal layer, wherein said thermally conductive metal layer is configured to spread heat from said device throughout said first heat sink;

wherein said thermally conductive metal layer is affixed to said first heat sink; and a second heat sink, said second heat sink comprising a conformable porous material region, said porous material region comprising a thermally conductive material in a 3-dimensional pore structure comprising interconnected pores with the surfaces of said pore structure providing surface area for heat to dissipate into the ambient, wherein said porous material region is thermally conductive.

40. The structure of claim 39, wherein said semiconductor device comprises a solid state light source, and said thermally conductive metal layer comprises a reflector positioned to reflect light from said light source into directional light emission.

41. The structure of claim 40, wherein the first heat sink is provided on an outside surface of the reflector.

42. The structure of claim 40, wherein the first heat sink is bonded to an outside surface of the reflector.

43. The structure of claim 42, wherein the first heat sink is bonded to the outside surface of the reflector by a conductive adhesive.

44. The structure of claim 40, further comprising a heat conductive path between the first heat sink and the reflector.

45. The structure of claim 39, further comprising a circuit board, said semiconductor device mounted to said circuit board, and said first heat sink mounted to said circuit board such that heat from said device transmits into said first heat sink.

46. The structure of claim 39, further comprising a circuit board and a reflector, wherein said semiconductor device comprises a solid state light source, said reflector and light source mounted to said circuit board such that said reflector reflects at least some of said light from said emitter into directional light emission.

47. The structure of claim 46, wherein said first heat sink is mounted to said circuit board such that heat from said light source transmits into said first heat sink.

48. The structure of claim 46, further comprising a second heat sink mounted to said circuit board such that the light source heat transmits into said second heat sink.

49. The structure of claim 39, wherein said semiconductor device comprises a solid state power device, and further comprising a second heat sink at least partially comprising a porous material region, said porous material region comprising a thermally conductive material in a 3-dimensional pore structure with the surfaces of said pore structure providing surface area for heat to dissipate into the ambient, said power device sandwiched between said first and second heat sinks.

50. The structure of claim 49, further comprising a circuit board, said power device mounted to said circuit board, said circuit board and power device sandwiched between said first and second heat sinks.

51. The structure of claim 39, wherein the porous material region comprises dimensions and porosity that provide for an optimum conductive heat transfer.

52. The structure of claim 39, wherein the thermally conductive metal layer is affixed to the first heat sink by a thermally conductive adhesive.

53. A high power semiconductor component structure, comprising:

a semiconductor device configured to operate in response to an electrical signal, said device heating up during operation in response to said electrical signal; and a first heat sink covering a surface of said semiconductor device and positioned in thermal contact with said semiconductor device such that heat from said device transmits into said first heat sink, said first heat sink comprising a porous material region, said porous material region comprising a thermally conductive material in a 3-dimensional pore structure comprising interconnected pores with the surfaces of said pore structure providing surface area for heat to dissipate into the ambient, said heat sink comprising a graded porous material region wherein part of said porous material region comprises a higher density pore structure than the remaining of said region.

54. An optical device, comprising:

a solid state light source;

a reflector positioned to reflect light from said light source into directional light emission, heat from said light source at least partially transmitting into said reflector; and a first heat sink mounted to said reflector positioned in thermal contact with said light source such that heat from said light source transmits into said first heat sink, said first heat sink comprising a thermally conductive conformable porous material layer adjacent said light source, said porous material layer further comprising a graded porous material region wherein part of said porous material region comprises a higher density pore structure than the remainder of said region, said first heat sink shaped to fit around said reflector, wherein said reflector is configured to spread heat from said light source throughout said first heat sink;

wherein said reflector comprises a reflective metal and wherein said reflector is affixed to said first heat sink.

55. The device of claim 54, further comprising a circuit board, said light source mounted to said circuit board, and said first heat sink mounted to said circuit board such that heat from said light source transmits at least partially into said first heat sink.

56. The device of claim 54, wherein the first heat sink is provided on an outside surface of the reflector.

57. The device of claim 54, wherein the first heat sink is bonded to an outside surface of the reflector.

58. The device of claim 57, wherein the first heat sink is bonded to the outside surface of the reflector by a conductive adhesive.

59. The device of claim 54, further comprising a heat conductive path between the first heat sink and the reflector.

60. The device of claim 54, wherein the reflector is affixed to the first heat sink by a thermally conductive adhesive.

* * * * *